(12) United States Patent
Mukunoki et al.

(10) Patent No.: US 10,581,337 B2
(45) Date of Patent: Mar. 3, 2020

(54) POWER CONVERTER

(71) Applicant: Mitsubishi Electric Corporation, Chiyoda-ku (JP)

(72) Inventors: Yasushige Mukunoki, Chiyoda-ku (JP); Yasushi Nakayama, Chiyoda-ku (JP); Hiroyasu Iwabuki, Chiyoda-ku (JP); Yuki Ishii, Chiyoda-ku (JP); Keisuke Iwasawa, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/735,987

(22) PCT Filed: Jul. 14, 2016

(86) PCT No.: PCT/JP2016/070822
§ 371 (c)(1),
(2) Date: Dec. 13, 2017

(87) PCT Pub. No.: WO2017/014143
PCT Pub. Date: Jan. 26, 2017

(65) Prior Publication Data
US 2018/0159439 A1    Jun. 7, 2018

(30) Foreign Application Priority Data
Jul. 21, 2015   (JP) .................................. 2015-143723

(51) Int. Cl.
*H02M 5/458* (2006.01)
*H02M 7/48* (2007.01)
(Continued)

(52) U.S. Cl.
CPC ............ *H02M 5/4585* (2013.01); *G05F 1/10* (2013.01); *H02M 1/4208* (2013.01); *H02M 1/44* (2013.01);
(Continued)

(58) Field of Classification Search
CPC ............ H02M 5/00; H02M 5/40; H02M 5/42; H02M 5/44; H02M 5/453; H02M 5/458;
(Continued)

(56) References Cited

U.S. PATENT DOCUMENTS 6,137,700 A * 10/2000 Iida ...................... H02M 1/4208
323/282
2001/0045863 A1 * 11/2001 Pelly ....................... H02M 1/12
327/552
(Continued)

FOREIGN PATENT DOCUMENTS

| JP | 08-098536 A | 4/1996 |
| JP | H10210649 | * 8/1998 |

(Continued)

OTHER PUBLICATIONS

English translation of JP H10210649.*
International Search Report dated Sep. 13, 2016 in PCT/JP2016/070822, filed on Jul. 14, 2016.

*Primary Examiner* — Alex Torres-Rivera
*Assistant Examiner* — Carlos O Rivera-Perez
(74) *Attorney, Agent, or Firm* — Oblon, McClelland, Maier & Neustadt, L.L.P.

(57) ABSTRACT

A diode rectifier rectifies an AC voltage output from a neutral-grounding three-phase AC power supply to a DC voltage. A smoothing capacitor smoothes the DC voltage rectified by the diode rectifier. An inverter converts the DC voltage smoothed by the smoothing capacitor into a desired AC voltage. A bidirectional switch and a Y capacitor are connected in series between one end of the smoothing capacitor and the ground. A detector detects a voltage across both ends of the smoothing capacitor. A controller drives the bidirectional switch in response to an output of the detector.

15 Claims, 7 Drawing Sheets

(51) Int. Cl.
*H02M 1/44* (2007.01)
*G05F 1/10* (2006.01)
*H02M 1/42* (2007.01)
*H02M 7/217* (2006.01)
*H02M 7/5387* (2007.01)
*H03K 7/08* (2006.01)

(52) U.S. Cl.
CPC ........... *H02M 7/2176* (2013.01); *H02M 7/48* (2013.01); *H02M 7/53875* (2013.01); *H03K 7/08* (2013.01); *H02M 2001/4283* (2013.01)

(58) Field of Classification Search
CPC .... H02M 5/4585; H02M 1/42; H02M 1/4208; H02M 1/1416; H02M 1/1425; H02M 1/425; H02M 1/4266; H02M 1/32; H02M 1/34; H02M 1/44; H02M 7/00; H02M 7/42; H02M 7/44; H02M 7/48; H02M 7/53; H02M 7/537; H02M 7/5387; H02M 7/53871; H02M 7/02; H02M 7/04; H02M 7/12; H02M 7/125; H02M 7/21; H02M 7/217; H02M 7/219; H02M 7/2176; H02M 7/53875; H02M 2001/322; H02M 2001/342; H02M 2001/344; H02M 2001/4283; H02M 2001/0009; H02M 2001/0016; H02M 2001/0019; H02M 2001/0022; H02M 5/45; H02M 5/451; H02M 5/452; H02M 1/12; H02M 1/126; H02M 1/14; H02M 1/143; H02M 1/15; H02M 7/53873; H02M 2001/32; H02M 2001/34; H02M 2001/36; H02M 2001/123; H02M 2007/4803; H02M 2007/4811; G05F 1/10; H03K 7/08; Y02B 70/10; Y02B 70/12; Y02B 70/123; Y02B 70/126; Y02B 70/14; Y02B 70/16; Y02B 70/1416; Y02B 70/1441; Y02B 70/145

USPC ..... 363/15–17, 21.02, 21.03, 34, 35, 37–47, 363/50, 56.12, 74, 79, 84, 95–98, 363/123–127, 131–134; 323/205–211, 323/266, 271–277, 282–286, 351; 327/551–559

See application file for complete search history.

(56) References Cited

U.S. PATENT DOCUMENTS

| | | | |
|---|---|---|---|
| 2003/0165070 A1* | 9/2003 | Maeda | H02M 1/12 363/84 |
| 2011/0096577 A1 | 4/2011 | Yamada | |
| 2014/0292347 A1* | 10/2014 | Chen | B60L 3/0069 324/509 |
| 2016/0172111 A1* | 6/2016 | Jun | H01G 4/38 361/329 |
| 2016/0322967 A1* | 11/2016 | Inakagata | H02M 3/33569 |

FOREIGN PATENT DOCUMENTS

| | | |
|---|---|---|
| JP | 2002-078352 A | 3/2002 |
| JP | 2005-192269 A | 7/2005 |
| JP | 2007-295694 A | 11/2007 |
| JP | 454800462 | 9/2010 |
| JP | 2011-120440 A | 6/2011 |
| JP | 2012-196113 A | 10/2012 |
| JP | 2013-059158 A | 3/2013 |
| WO | WO 2015104769 A1 * 7/2015 | ........ H02M 3/33569 |

* cited by examiner

US 10,581,337 B2

POWER CONVERTER

TECHNICAL FIELD

The present invention relates to power converters, and particularly, to a power converter that converts a neutral-grounding three-phase AC voltage into a DC voltage by a diode rectifier circuit and a smoothing capacitor, converts the DC voltage into a desired AC voltage by an inverter, and outputs the AC voltage.

BACKGROUND ART

A power converter achieves high-efficiency power conversion by a high-speed switching operation of power-conversion semiconductor elements. The high-speed switching operation is, however, also a source of electromagnetic noise. Electromagnetic noise can also cause malfunctions in power converters itself or peripheral electronic equipments. Therefore, a reduction in electromagnetic noise is an important technical issue to be addressed for developing power converters.

To address such an issue, PTD 1 (Japanese Patent No. 4548004) describes that in a PWM (pulse width modulation) inverter consists of a single-phase AC power supply, a diode rectifier, a smoothing capacitor, and an inverter, a larger capacitor than an output-side capacity of an inverter is connected between one end of a DC bus portion and the ground, resulting in reduction of noise.

CITATION LIST

Patent Documents

PTD 1: Japanese Patent No. 4548004

SUMMARY OF INVENTION

Technical Problem

In the PWM inverter described in Patent Document 1, however, voltage variations of AC power frequency that is superimposed on the DC bus portion are directly applied to a noise reducing capacitor located between one end of the DC bus portion and the ground, and generates a leakage current. Especially, a starting moment of the power converter when the smoothing capacitor is insufficiently charged, the voltage variations of AC power frequency become larger, and a leakage current value also increases proportionally. The leakage current may cause a leakage breaker to operate, leading to an impairment of operation reliability of the power converter.

The present invention therefore has an object to provide a power converter that can reduce noise while eliminating or reducing leakage current.

Solution to Problem

A power converter according to the present invention includes a rectifier circuit configured to rectify an AC voltage output from a neutral-grounding three-phase AC power supply to a DC voltage, a smoothing capacitor configured to smooth the DC voltage rectified by the rectifier circuit, a conversion circuit configured to convert the DC voltage smoothed by the smoothing capacitor into a desired AC voltage, a bidirectional switch and at least one Y capacitor connected in series between one end of the smoothing capacitor and the ground, a detector configured to detect a voltage across both ends of the smoothing capacitor, and a controller configured to drive the bidirectional switch in response to an output of the detector.

Advantageous Effects of Invention

The power converter of the present invention can reduce noise while eliminating or reducing leakage current.

DESCRIPTION OF EMBODIMENTS

Embodiments of the present invention will be described below with reference to the drawings.

Embodiment 1

Figure 1:
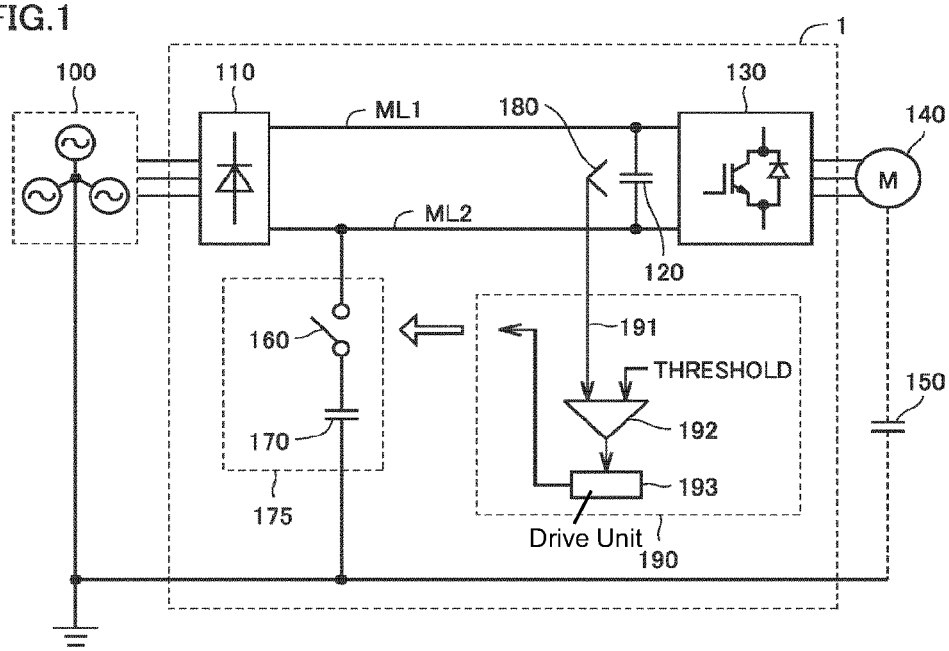
FIG. 1 is a circuit diagram of a power converter according to Embodiment 1.

FIG. 1 is a circuit diagram of a power converter 1 according to Embodiment 1.

As illustrated in FIG. 1, power converter 1 includes a diode rectifier 110, a smoothing capacitor 120, an inverter 130, a bypass circuit 175, a detector 180, and a controller 190. Bypass circuit 175 includes a bidirectional switch 160 and a Y capacitor 170. Controller 190 includes a comparator 192 and a drive unit 193.

Diode rectifier 110 rectifies an AC voltage output from a neutral-grounding three-phase AC power supply 100 to a DC voltage and outputs the DC voltage to DC buses ML1 and ML2.

Smoothing capacitor 120 smoothes the DC voltage rectified by diode rectifier 110.

Inverter 130 converts the DC voltage smoothed by smoothing capacitor 120 into a desired AC voltage, and drives an electric motor 140.

Bidirectional switch 160 and Y capacitor 170 are connected in series between one end of smoothing capacitor 120 and the ground. Y capacitor 170 reduces a high-frequency common-mode noise caused by switching of a switching element of inverter 130. Y capacitor 170 is composed of, for example, a ceramic capacitor or a film capacitor.

Detector 180 detects a voltage across both ends of smoothing capacitor 120.

Controller 190 drives bidirectional switch 160 in response to an output of detector 180. When an output value of detector 180 is greater than a first threshold, controller 190 brings bidirectional switch 160 into conduction.

Comparator 192 compares the voltage detected by detector 180 with the first threshold. Drive unit 193 controls on/off of bidirectional switch 160 based on the comparison result of comparator 192.

The first threshold in the present embodiment will now be described. In the case where a voltage value of smoothing capacitor 120 increases to this first threshold or more, a leakage current of an AC power frequency component, included in the voltage of smoothing capacitor 120, when variations in the voltage to ground of the AC power frequency component are applied to Y capacitor 170, which are caused by the voltage variations of the AC power frequency component, is reduced to the operation current value of a leakage breaker or less.

The operation of power converter 1 of FIG. 1 will now be described.

A three-phase AC voltage across neutral-grounding three-phase AC power supply 100 is rectified by diode rectifier 110 and is then turned into a DC voltage by smoothing capacitor 120. This DC voltage is converted into a desired AC voltage through well-known PWM control by inverter 130, so that electric motor 140 is driven by the AC voltage.

A stray capacitance 150 exists between electric motor 140 and the ground. When inverter 130 is driven through PWM control, voltage variations are applied to stray capacitance 150 by the switching operation of power-conversion semiconductor elements of inverter 130, and generate a common mode current. This common mode current propagates toward three-phase AC power supply 100 through a path to the ground.

Figure 2:
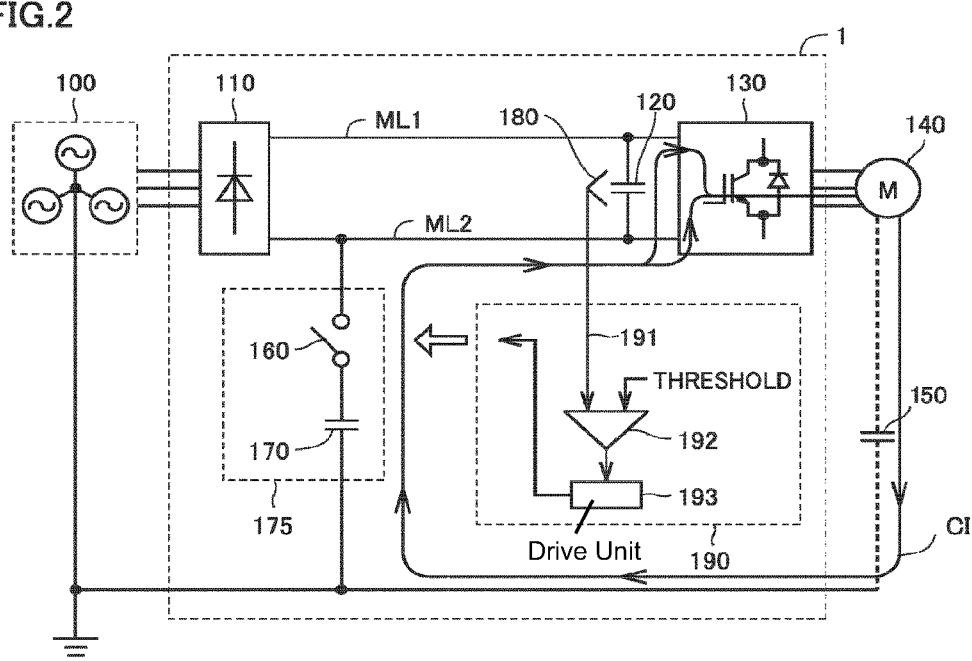
FIG. 2 illustrates a flow of a common mode current.

Detector 180 detects a voltage across both ends of smoothing capacitor 120 and outputs a voltage value 191 to controller 190. Comparator 192 of controller 190 compares voltage value 191 with the first threshold, and when voltage value 191>first threshold, bidirectional switch 160 is brought into conduction. Bringing bidirectional switch 160 into conduction causes a common mode current CI to circulate via Y capacitor 170 as illustrated in FIG. 2, resulting in lower noise.

In the present embodiment, bidirectional switch 160 turns on the condition that voltage value>first threshold, that is, the condition that smoothing capacitor 120 is sufficiently charged and voltage variations of an AC power frequency that is superimposed on DC buses ML1 and ML2 are also reduced. This eliminates or reduces a leakage current generated from Y capacitor 170, avoiding a leakage breaker malfunction.

As described above, the present embodiment can achieve a power converter that has lower noise and avoids a leakage breaker malfunction.

Although the present embodiment has described the generation of a common mode current using stray capacitance 150 between electric motor 140 and the ground, the present invention is not limited thereto. For example, a stray capacitance between inverter 130 and the ground or a stray capacitance between a cable of electric motor 140 and the ground may be used.

Although bidirectional switch 160 and Y capacitor 170 are connected to the negative side of the DC bus in the present embodiment, similar effects can also be achieved by adding them to the positive side of the DC bus. Further, similar effects can also be achieved by adding bidirectional switch 160 and Y capacitor 170 to both the negative side and the positive side.

Embodiment 2

Figure 3:
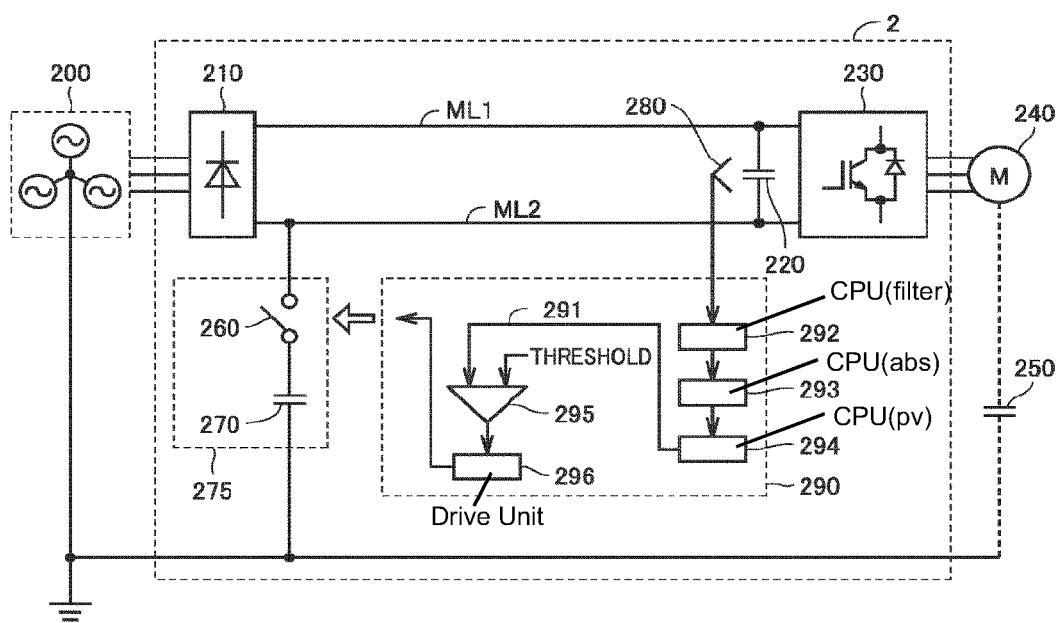
FIG. 3 is a circuit diagram of a power converter according to Embodiment 2.

FIG. 3 is a circuit diagram of a power converter 2 according to Embodiment 2.

As illustrated in FIG. 3, power converter 2 includes a diode rectifier 210, a smoothing capacitor 220, an inverter 230, an electric motor 240, a bypass circuit 275, a detector 280, and a controller 290. Bypass circuit 275 includes a bidirectional switch 260 and a Y capacitor 270. Controller 290 includes a computing unit (filter) 292, a computing unit (absolute value) 293, a computing unit (peak value) 294, a comparator 295, and a drive unit 296.

Diode rectifier 210 rectifies an AC voltage output from a neutral-grounding three-phase AC power supply 200 to a DC voltage and outputs the DC voltage to DC buses ML1 and ML2.

Smoothing capacitor 220 smoothes the DC voltage rectified by diode rectifier 210.

Inverter 230 converts the DC voltage smoothed by smoothing capacitor 220 into a desired AC voltage and drives electric motor 240.

Bidirectional switch 260 and Y capacitor 270 are connected in series between one end of smoothing capacitor 220 and the ground. Y capacitor 270 reduces the noise caused by switching of switching elements of inverter 230.

Detector 280 detects a voltage across both ends of smoothing capacitor 220.

Controller 290 drives bidirectional switch 260 in response to an output of detector 280.

Computing unit (filter) 292 extracts an AC power frequency component of the voltage detected by detector 280.

Computing unit (absolute value) 293 outputs an absolute value of the voltage having the AC power frequency component output from computing unit (filter) 292.

Computing unit (peak value) 294 outputs a peak value of the absolute value output from computing unit (absolute value) 293.

Comparator 295 compares the output of computing unit (peak value) 294 with a second threshold.

Drive unit 296 brings bidirectional switch 260 into conduction when the comparison result of comparator 295 indicates that peak value<second threshold.

The second threshold in the present embodiment will now be described. This second threshold value is a voltage value of an AC power supply frequency component. In the case where the detected value decreases to this second threshold or less, a leakage current of an AC power frequency component, included in the voltage of smoothing capacitor 220, when variations in the voltage to ground of the AC power frequency component to Y capacitor 170, which are caused by the voltage variations of the AC power frequency component, is reduced to the operation current value of a leakage breaker or less.

The operation of power converter 2 of FIG. 3 will now be described.

A three-phase AC voltage across neutral-grounding three-phase AC power supply 200 is rectified by diode rectifier 210 and is then turned into a DC voltage by smoothing capacitor 220. This DC voltage is converted into a desired AC voltage through well-known PWM control by inverter 230, so that electric motor 240 is driven by the AC voltage.

A stray capacitance 250 exists between electric motor 240 and the ground. When inverter 230 is driven through PWM control, voltage variations are applied to stray capacitance 250 by a switching operation of power-conversion semiconductor elements of inverter 230, and generate a common mode current. This common mode current propagates toward three-phase AC power supply 200 through a path to the ground.

Detector 280 detects a voltage across smoothing capacitor 220 and outputs a detected voltage value to controller 290. The detected voltage value is turned into an AC power frequency component by computing unit (filter) 292, and the AC power frequency component is converted into an absolute value by computing unit (absolute value) 293. The absolute value is then converted into a peak value 291 by computing unit (peak value) 294, and the peak value 291 is compared with the second threshold by comparator 295. When peak value 291<second threshold, bidirectional switch 260 is brought into conduction.

In the present embodiment, bringing bidirectional switch 260 into conduction causes a common mode current to circulate via Y capacitor 270, resulting in lower noise.

In the present embodiment, bidirectional switch 260 turns on the condition that peak value 291<second threshold, that is, the condition that smoothing capacitor 220 is sufficiently charged and voltage variations of an AC power frequency that is superimposed on DC buses ML1 and ML2 are also reduced. This eliminates or reduces a leakage current generated from Y capacitor 270, avoiding a leakage breaker malfunction.

In the present embodiment, an AC power frequency component of the voltage detected by detector 280 is extracted, and the operation of drive unit 296 is determined, thus enabling high-precision control. This increases a capacitance of Y capacitor 270 to an operating limit of the leakage breaker, resulting in lower noise.

As described above, the present embodiment can achieve a power converter that has lower noise characteristics and avoids a leakage breaker malfunction.

Although the present embodiment has been described using computing unit (peak value) 294, the present invention is not limited thereto. Alternatively, another computing unit, for example, a computing unit (average value) may be used.

Embodiment 3

Figure 4:
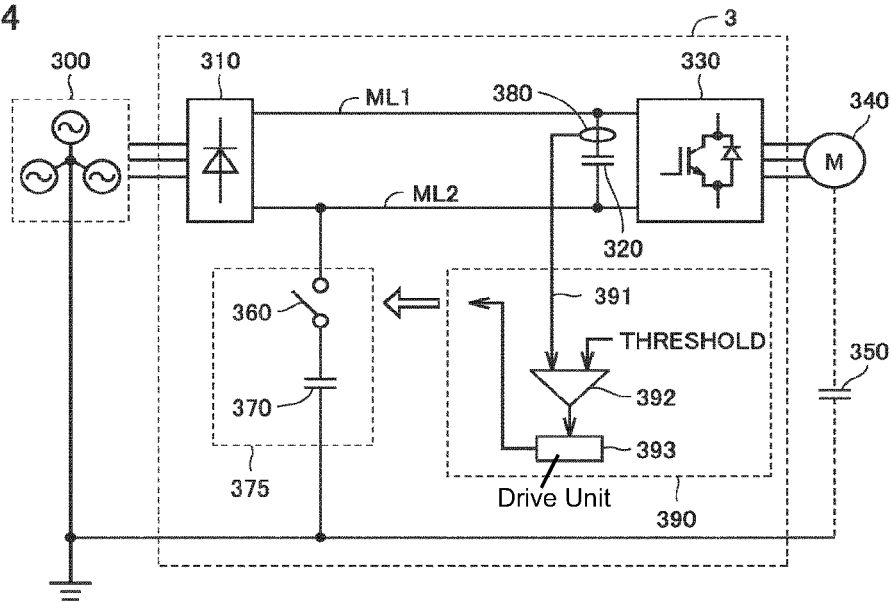
FIG. 4 is a circuit diagram of a power converter according to Embodiment 3.

FIG. 4 is a circuit diagram of a power converter 3 according to Embodiment 3.

As illustrated in FIG. 4, power converter 3 includes a diode rectifier 310, a smoothing capacitor 320, an inverter 330, a bypass circuit 375, and a controller 390. Bypass circuit 375 includes a bidirectional switch 360 and a Y capacitor 370. Controller 390 includes a comparator 392 and a drive unit 393.

Diode rectifier 310 rectifies an AC voltage output from a neutral-grounding three-phase AC power supply 300 into a DC voltage and outputs the DC voltage to DC buses ML1 and ML2.

Smoothing capacitor 320 smoothes the DC voltage rectified by diode rectifier 310.

Inverter 330 converts the DC voltage smoothed by smoothing capacitor 320 into a desired AC voltage and drives electric motor 340.

Bidirectional switch 360 and Y capacitor 370 are connected in series between one end of smoothing capacitor 320 and the ground. Y capacitor 370 reduces the noise caused by switching of a switching element of inverter 330.

Detector 380 detects a current flowing through smoothing capacitor 320.

Controller 390 drives bidirectional switch 360 in response to an output of detector 380.

Controller 390 brings bidirectional switch 360 into conduction when an output value of detector 380 is smaller than a third threshold.

Comparator 392 compares the current detected by detector 380 with the third threshold.

The third threshold in the present embodiment will now be described. This third threshold value is a current value. In the case where the detected value decreases to this third threshold or less, a leakage current of an AC power frequency component, included in the voltage of smoothing capacitor 320, when the variations in the voltage to ground of the AC power frequency component, which are caused by the voltage variations of the AC power frequency component, are applied to Y capacitor 170, is reduced to the operation current value of a leakage breaker or less.

Drive unit 393 controls on/off of bidirectional switch 360 based on the comparison result of comparator 392.

The operation of power converter 3 of FIG. 4 will now be described.

A three-phase AC voltage across neutral-grounding three-phase AC power supply 300 is rectified by diode rectifier 310 and is then turned into a DC voltage by smoothing capacitor 320. This DC voltage is converted into a desired AC voltage through well-known PWM control by inverter 330, so that electric motor 340 is driven by the AC voltage.

A stray capacitance 350 exists between electric motor 340 and the ground. When inverter 330 is driven through PWM control, voltage variations are applied to stray capacitance 350 by a switching operation of a power-conversion semiconductor element of inverter 330, thereby generating a common mode current. This common mode current propagates toward three-phase AC power supply 300 through a path to the ground.

Detector 380 detects a current through smoothing capacitor 320 and outputs a current value 391 of the detected current to controller 390. Current value 391 is compared with the third threshold by comparator 392 and, when current value 391<third threshold, bidirectional switch 360 is brought into conduction.

Bringing bidirectional switch 360 into conduction causes a common mode current to circulate via Y capacitor 370, resulting in lower noise characteristics.

In the present embodiment, bidirectional switch 360 turns on the condition that current value 391<third threshold, that is, the condition that smoothing capacitor 320 is sufficiently charged and voltage variations of an AC power frequency that is superimposed on DC buses ML1 and ML2 are also reduced. This eliminates or reduces a leakage current generated from Y capacitor 370, avoiding a leakage breaker malfunction.

Thus, the present embodiment can achieve a power converter that has lower noise characteristics and avoids a leakage breaker malfunction.

Embodiment 4

Figure 5:
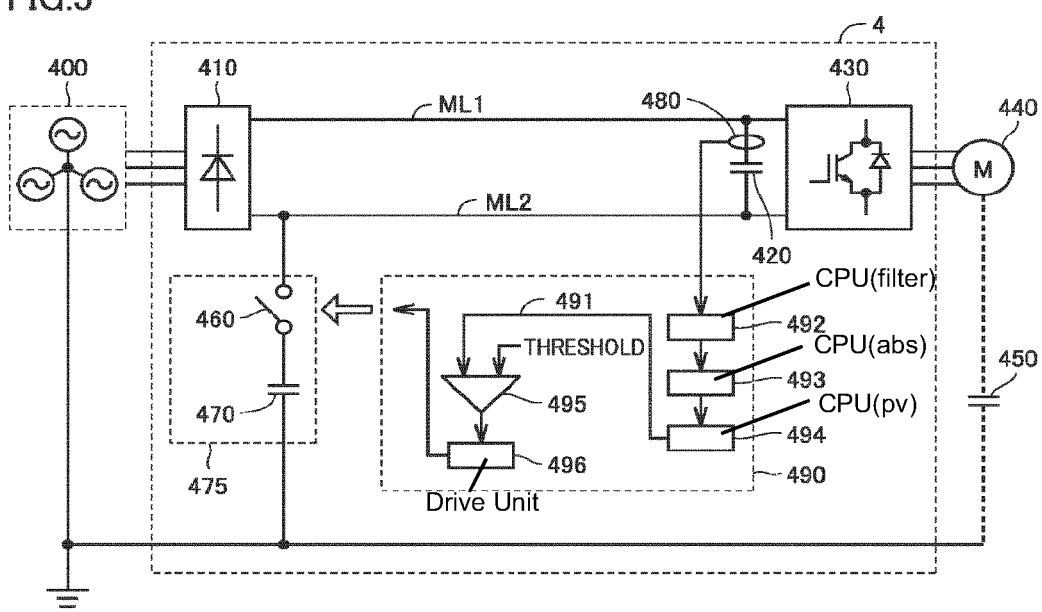
FIG. 5 is a circuit diagram of a power converter according to Embodiment 4.

FIG. 5 is a circuit diagram of a power converter 4 according to Embodiment 4.

As illustrated in FIG. 5, power converter 4 includes a diode rectifier 410, a smoothing capacitor 420, an inverter 430, a bypass circuit 475, a detector 480, and a controller 490. Bypass circuit 475 includes a bidirectional switch 460 and a Y capacitor 470. Controller 490 includes a computing unit (filter) 492, a computing unit (absolute value) 493, a computing unit (peak value) 494, a comparator 495, and a drive unit 496.

Diode rectifier 410 rectifies an AC voltage output from a neutral-grounding three-phase AC power supply 400 into a DC voltage and outputs the DC voltage to DC buses ML1 and ML2.

Smoothing capacitor 420 smoothes the DC voltage rectified by diode rectifier 410.

Inverter 430 converts the DC voltage smoothed by smoothing capacitor 420 into a desired AC voltage and drives electric motor 440.

Bidirectional switch 460 and Y capacitor 470 are connected in series between one end of smoothing capacitor 420 and the ground. Y capacitor 470 reduces the noise caused by switching of a switching element of inverter 430.

Detector 480 detects a current flowing through smoothing capacitor 420.

Controller 490 drives bidirectional switch 460 in response to an output of detector 480.

Computing unit (filter) 492 extracts an AC power frequency component of the current detected by detector 480.

Computing unit (absolute value) 493 outputs an absolute value of the current having the AC power frequency component output from computing unit (filter) 492.

Computing unit (peak value) 494 outputs a peak value of the absolute value output from computing unit (absolute value) 493.

Comparator 495 compares the output of computing unit (peak value) 494 with a fourth threshold.

Drive unit 496 brings bidirectional switch 460 turns on when the comparison result of comparator 495 indicates that peak value<fourth threshold.

The fourth threshold in the present embodiment will now be described. This fourth threshold is an AC power frequency component of the value of the current flowing into smoothing capacitor 420. In the case where a detected value decreases to this fourth threshold or less, a leakage current of the AC power frequency component, included in the voltage of smoothing capacitor 420, when variations in the voltage to ground of the AC power supply frequency component, which are caused by the voltage variations of the AC power frequency component, are applied to Y capacitor 170 is reduced to the operation current value of a leakage breaker or less.

The operation of power converter 4 of FIG. 5 will now be described.

A three-phase AC voltage from neutral-grounding three-phase AC power supply 400 is rectified by diode rectifier 410 and is then turned into a DC voltage by smoothing capacitor 420. This DC voltage is converted into a desired AC voltage through well-known PWM control by inverter 430, so that electric motor 440 is driven by the AC voltage.

A stray capacitance 450 exists between electric motor 440 and the ground. When inverter 430 is driven through PWM control, voltage variations are applied to stray capacitance 450 by the switching operation of a power-conversion semiconductor element of inverter 430, and generate a common mode current. This common mode current propagates toward the AC power supply through a path to the ground.

Detector 480 detects the current through smoothing capacitor 420 and outputs a value of the detected current to controller 490. The value of the detected current is turned into an AC power frequency component by computing unit (filter) 492, and the AC power frequency component is converted into an absolute value by computing unit (absolute value) 493. The absolute value is then converted into a peak value 491 by computing unit (peak value) 494, and the peak value 491 is compared with the fourth threshold by comparator 495, thereby bringing bidirectional switch 460 into conduction on the condition that peak value 491<fourth threshold.

Bringing bidirectional switch 460 into conduction causes a common mode current to circulate via Y capacitor 470, resulting in lower noise characteristics.

In the present embodiment, bidirectional switch 460 turns on the condition that peak value 491<fourth threshold, that is, the condition that smoothing capacitor 420 is sufficiently charged and voltage variations of an AC power frequency superimposed on DC buses ML1 and ML2 are also reduced. This eliminates or reduces a leakage current generated from Y capacitor 470, avoiding a leakage breaker malfunction.

In the present embodiment, an AC power frequency component is extracted by the value of the detected current, and the operation of drive unit 496 is determined, thus enabling high-precision control. This increases a capacitance of Y capacitor 470 to an operating limit of the leakage breaker, resulting in lower noise.

As described above, the present embodiment can achieve a power converter that has lower noise characteristics and avoids a leakage breaker malfunction.

Although the present embodiment has been described using the computing unit (peak value) 494, the present invention is not limited thereto. Alternatively, another computing unit, for example, a computing unit (average value) may be used.

Embodiment 5

Figure 6:
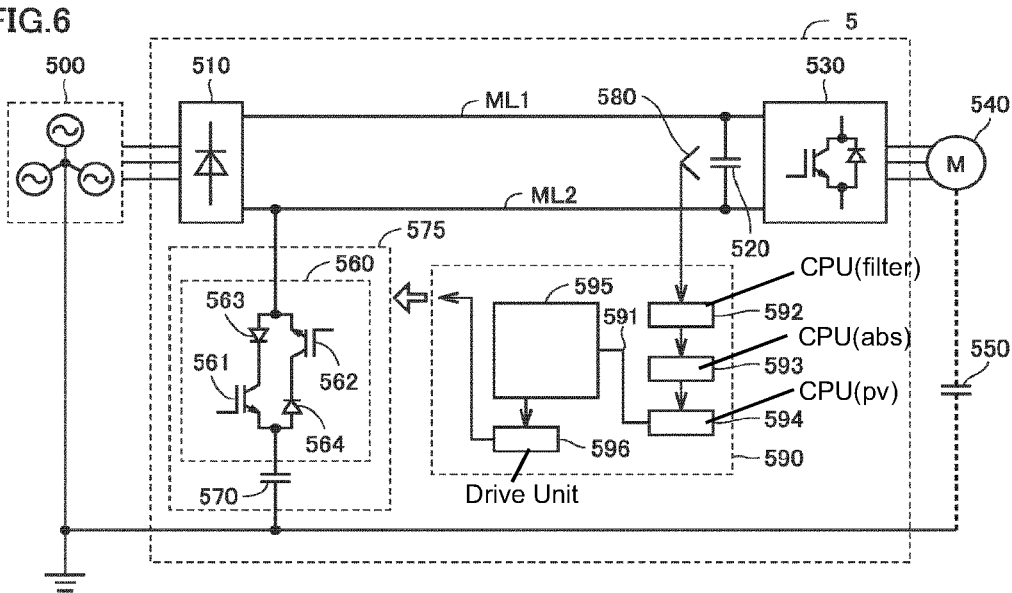
FIG. 6 is a circuit diagram of a power converter according to Embodiment 5.

FIG. 6 is a circuit diagram of a power converter 5 according to Embodiment 5.

As illustrated in FIG. 6, power converter 5 includes a diode rectifier 510, a smoothing capacitor 520, an inverter 530, a bypass circuit 575, a detector 580, and a controller 590. Bypass circuit 575 includes a bidirectional switch 560 and a Y capacitor 570. Bidirectional switch 560 includes an IGBT 561, an IGBT 562, a diode 563, and a diode 564. Controller 590 includes a computing unit (filter) 592, a computing unit (absolute value) 593, a computing unit (peak value) 594, a data table 595, and a drive unit 596.

Diode rectifier 510 rectifies an AC voltage output from a neutral-grounding three-phase AC power supply 500 to a DC voltage and outputs the DC voltage to DC buses ML1 and ML2.

Smoothing capacitor 520 smoothes the DC voltage rectified by diode rectifier 510.

Inverter 530 converts the DC voltage smoothed by smoothing capacitor 520 into a desired AC voltage and drives electric motor 540.

Bidirectional switch 560 and Y capacitor 570 are connected in series between one end of smoothing capacitor 520 and the ground. Y capacitor 570 reduces the noise caused by switching of switching elements of inverter 530.

Detector 580 detects a voltage across both ends of smoothing capacitor 520.

Controller 590 drives bidirectional switch 560 in response to an output of detector 580.

Computing unit (filter) 592 extracts an AC power frequency component of the voltage detected by detector 580.

Computing unit (absolute value) 593 outputs an absolute value of the voltage having the AC power frequency component output from computing unit (filter) 592.

Computing unit (peak value) 594 outputs a peak value of the absolute value output from computing unit (absolute value) 593.

Data table 595 determines a correspondence between the magnitude of a gate voltage across an IGBT and a peak value of an absolute value of a voltage having an AC power frequency component of DC buses ML1 and ML2. Data table 595 is determined such that at a higher peak value of the absolute value of the voltage having the AC power frequency component, a gate voltage across the IGBT becomes lower, and an on-resistance value of the IGBT becomes higher. Data table 595 is determined such that at a lower peak value of the absolute value of the voltage having the AC power frequency component, the gate voltage across the IGBT becomes higher, and the on-resistance value of the IGBT becomes lower.

Drive unit 596 provides IGBTs 561 and 562 with a gate voltage having the magnitude of the gate voltage output from data table 595 and controls the conduction of bidirectional switch 560.

Bidirectional switch 560 includes IGBTs 561 and 562 connected in inverse parallel, a diode 563 connected in series with IGBT 561, and a diode 564 connected in series with IGBT 562.

The operation of power converter 5 of FIG. 6 will now be described.

A three-phase AC voltage across neutral-grounding three-phase AC power supply 500 is rectified by diode rectifier 510 and is then turned into a DC voltage by smoothing capacitor 520. This DC voltage is converted into a desired AC voltage through well-known PWM control by inverter 530, so that electric motor 540 is driven by the AC voltage.

A stray capacitance 550 exists between electric motor 540 and the ground. When inverter 530 is driven through PWM control, voltage variations are applied to stray capacitance 550 by a switching operation of a power-conversion semiconductor element of inverter 530, and generate a common mode current. This common mode current propagates toward three-phase AC power supply 500 through a path to the ground.

Detector 580 detects a voltage across both ends of smoothing capacitor 520 and outputs a detected voltage value to controller 590. An AC power frequency component is extracted from the detected voltage value by computing unit (filter) 592, and the AC power frequency component is converted into an absolute value by computing unit (absolute value) 593. The absolute value is then converted into a peak value 591 by computing unit (peak value) 594. Data table 595 outputs, to drive unit 596, the magnitude of a gate voltage corresponding to peak value 591. Drive unit 596 outputs the gate voltage having the instructed magnitude to the gates of IGBTs 561 and 562, so that bidirectional switch 560 is driven.

In the present embodiment, the on-resistances of IGBTs 561 and 562 of bidirectional switch 560 are adjusted in accordance with a voltage value of the AC power frequency component superimposed on DC buses ML1 and ML2, thereby achieving lower noise even when smoothing capacitor 520 is not charged sufficiently.

In the present embodiment, IGBTs 561 and 562 of bidirectional switch 560 can be used as damping resistors, resulting in lower noise even when a resonance occurs in a path including bidirectional switch 560.

In the present embodiment, a leakage current can be eliminated or reduced by adjusting the conduction resistances of IGBTs 561 and 562 of bidirectional switch 560 in accordance with the voltage value of an AC power frequency component superimposed on DC buses ML1 and ML2, avoiding a leakage breaker malfunction.

As described above, the present embodiment can achieve a power converter that has lower noise and avoids a leakage breaker malfunction.

Although the present embodiment has described the switch including IGBTs 561 and 562 connected in inverse parallel, diode 563 connected in series with IGBT 561, and diode 564 connected in series with IGBT 562 as a specific configuration of the bidirectional switch of Embodiment 1, the present invention is not limited thereto. Similarly, a bidirectional switch having such a configuration can also be used for the configuration of another embodiment.

Embodiment 6

Figure 7:
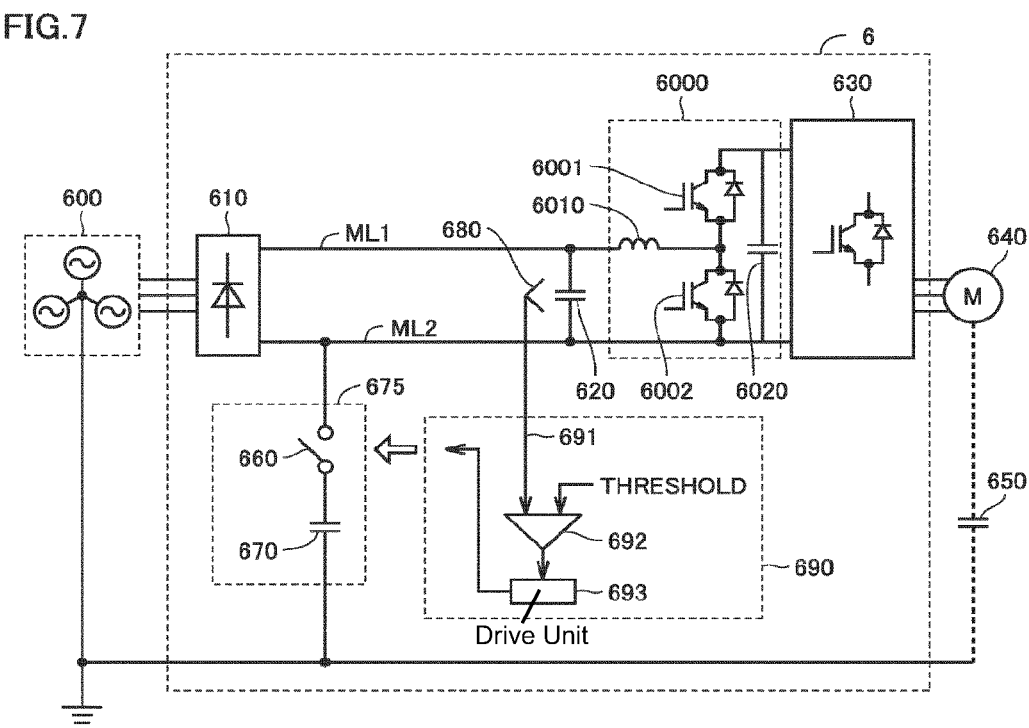
FIG. 7 is a circuit diagram of a power converter according to Embodiment 6.

FIG. 7 is a circuit diagram of a power converter 6 according to Embodiment 6.

As illustrated in FIG. 7, power converter 6 includes a diode rectifier 610, a first smoothing capacitor 620, an inverter 630, a bypass circuit 675, a detector 680, a controller 690, and a chopper 6000. Bypass circuit 675 includes a bidirectional switch 660 and a Y capacitor 670. Chopper 6000 includes power-conversion semiconductor elements 6001 and 6002, a reactor 6010, and a second smoothing capacitor 6020. Controller 690 includes a comparator 692 and a drive unit 693.

Diode rectifier 610 rectifies an AC voltage output from a neutral-grounding three-phase AC power supply 600 to a DC voltage and outputs the DC voltage to DC buses ML1 and ML2.

First smoothing capacitor 620 smoothes the DC voltage rectified by diode rectifier 610.

Power-conversion semiconductor elements 6001 and 6002 in chopper 6000 convert the DC voltage across first smoothing capacitor 620 into a desired DC voltage. Second smoothing capacitor 6020 in chopper 6000 smoothes the DC voltage converted by power-conversion semiconductor elements 6001 and 6002.

Inverter 630 converts the DC voltage smoothed by second smoothing capacitor 6020 into a desired AC voltage and drives electric motor 640.

Bidirectional switch 660 and Y capacitor 670 are connected in series between one end of first smoothing capacitor 620 and the ground. Y capacitor 670 reduces the noise caused by switching of a switching element of inverter 630.

Detector 680 detects a voltage across both ends of first smoothing capacitor 620.

Controller 690 drives bidirectional switch 660 in response to an output of detector 680.

Comparator 692 compares the voltage detected by detector 680 with the first threshold.

Drive unit 693 controls on/off of bidirectional switch 660 based on the comparison result of comparator 692.

The operation of power converter 6 of FIG. 7 will now be described.

A three-phase AC voltage across neutral-grounding three-phase AC power supply 600 is rectified by diode rectifier 610 and is then turned into a DC voltage by first smoothing capacitor 620. The DC voltage across first smoothing capacitor 620 is converted into a desired DC voltage by chopper 6000 and is then maintained by second smoothing capacitor 6020. The DC voltage across second smoothing capacitor 6020 is converted into a desired AC voltage through well-known PWM control by inverter 630, so that electric motor 640 is driven by the AC voltage.

A stray capacitance 650 exists between electric motor 640 and the ground. When inverter 630 is driven through PWM control, voltage variations are applied to stray capacitance 650 by the switching operation of a power-conversion semiconductor element of inverter 630, and generate a common mode current. This common mode current propagates toward three-phase AC power supply 600 through a path to the ground.

Detector 680 detects a voltage across first smoothing capacitor 620 and outputs a voltage value 691 to controller 690. Voltage value 691 is compared with the first threshold by comparator 692, and bidirectional switch 660 is brought into conduction on the condition that voltage value 691>first threshold.

Bringing bidirectional switch 660 that is in conduction causes a common mode current to circulate via Y capacitor 670, resulting in lower noise.

In the present embodiment, bidirectional switch 660 turns on the condition that voltage value 691>first threshold, that is, the condition that first smoothing capacitor 620 is sufficiently charged and voltage variations of an AC power frequency superimposed on DC buses ML1 and ML2 are also reduced. This eliminates or reduces a leakage current generated from Y capacitor 670, avoiding a leakage breaker malfunction.

As described above, the present embodiment can achieve a power converter that has lower noise characteristics and avoids a leakage breaker malfunction.

Although the present embodiment has described the configuration obtained by adding a chopper to the configuration of Embodiment 1, the present invention is not limited thereto. Similarly, the chopper can also be added to the configuration of any other embodiment.

Embodiment 7

Figure 8:
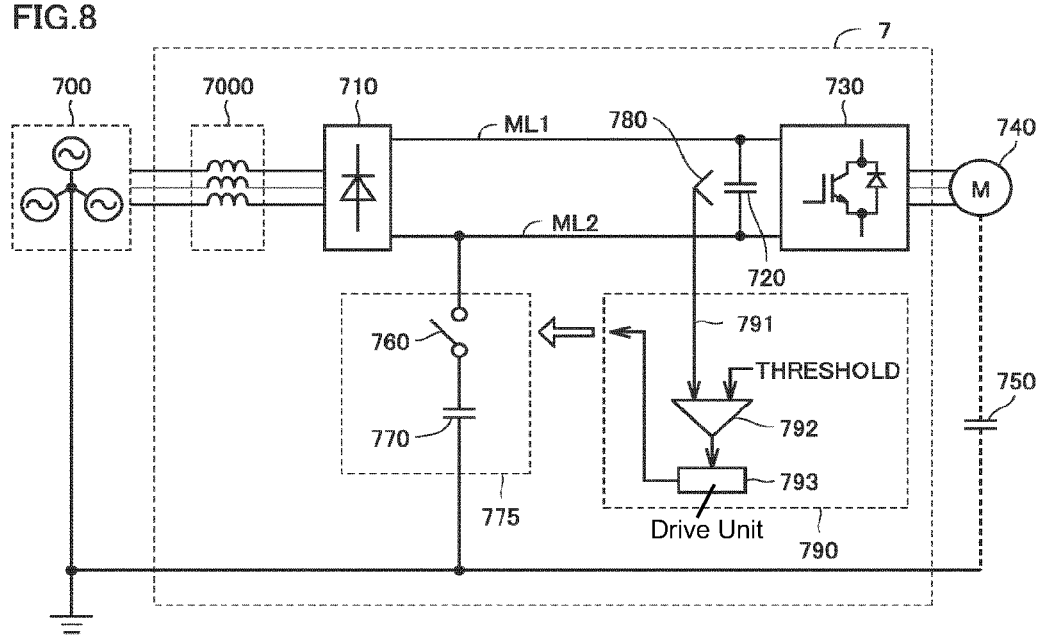
FIG. 8 is a circuit diagram of a power converter according to Embodiment 7.

FIG. 8 is a circuit diagram of a power converter according to Embodiment 7.

As illustrated in FIG. 8, power converter 7 includes a common-mode choke coil 7000, a diode rectifier 710, a smoothing capacitor 720, an inverter 730, a detector 780, a bypass circuit 775, and a controller 790. Bypass circuit 775 includes a bidirectional switch 760 and a Y capacitor 770. Controller 790 includes a comparator 792 and a drive unit 793.

Common-mode choke coil 7000 is disposed in a three-phase AC power supply line between diode rectifier 710 and a three-phase AC power supply 700. Common-mode choke coil 7000 has a normal-mode noise reducing force using leakage current.

Figure 9:
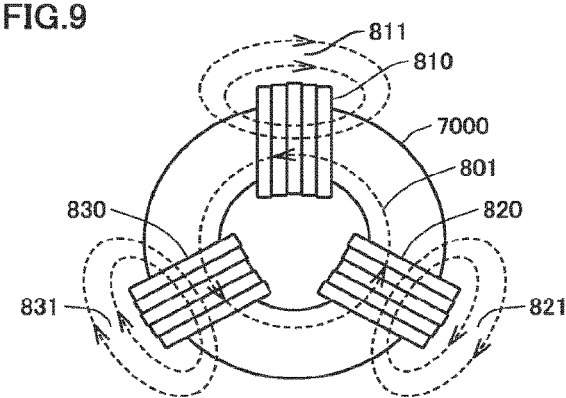
FIG. 9 is a schematic diagram of a common-mode choke coil according to Embodiment 7.

FIG. 9 illustrates common-mode choke coil 7000.

As illustrated in FIG. 9, common-mode choke coil 7000 is connected to an R-phase 810 of the three-phase AC power supply line, an S-phase 820 of the three-phase AC power supply line, and a T-phase 830 of the three-phase AC power supply line.

The operation of common-mode choke coil 7000 of FIG. 9 will now be described.

R-phase 810 of the three-phase AC power supply line, S-phase 820 of the three-phase AC power supply line, and T-phase 830 of the three-phase AC power supply line are wound around common-mode choke coil 7000 at the same frequency, where a common-mode noise current is attenuated to reduce a common-mode noise characteristics. Since R-phase 810, S-phase 820, and T-phase 830 of the three-phase AC power supply line are wound loosely, R-phase 810, S-phase 820, and T-phase 830 of the three-phase AC power supply line have inductance components due to leakage magnetic fields 811, 821, and 831, respectively. The inductance component functions as a normal-mode impedance, which provides a normal-mode noise reducing force.

Thus, common-mode choke coil 7000 effectively functions for both the common mode and the normal mode.

Referring to FIG. 8 again, diode rectifier 710 rectifies the AC voltage output from neutral-grounding three-phase AC power supply 700 to a DC voltage and outputs the DC voltage to DC buses ML1 and ML2.

Smoothing capacitor 720 smoothes the DC voltage rectified by diode rectifier 710.

Inverter 730 converts the DC voltage smoothed by smoothing capacitor 720 into a desired AC voltage and drives electric motor 740.

Bidirectional switch 760 and Y capacitor 770 are connected in series between one end of smoothing capacitor 720 and the ground. Y capacitor 770 reduces the noise caused by switching of a switching element of inverter 730.

Detector 780 detects a voltage across both ends of smoothing capacitor 720.

Controller 790 drives bidirectional switch 760 in response to an output of detector 780.

Controller 790 brings bidirectional switch 760 into conduction when the output value of detector 780 is smaller than the first threshold.

Comparator 792 compares the voltage detected by detector 780 with the first threshold.

Drive unit 793 controls on/off of bidirectional switch 760 based on the comparison result of comparator 792.

The operation of power converter 7 of FIG. 8 will now be described.

A three-phase AC voltage across neutral-grounding three-phase AC power supply 700 is rectified by diode rectifier 710 and is then turned into a DC voltage by smoothing capacitor 720. This DC voltage is converted into a desired AC voltage through well-known PWM control by inverter 730, so that electric motor 740 is driven by the AC voltage.

A stray capacitance 750 exists between electric motor 740 and the ground. When inverter 730 is driven through PWM control, voltage variations are applied to stray capacitance 750 by the switching operation of a power-conversion semiconductor element of inverter 730, and generate a common mode current. This common mode current propagates toward three-phase AC power supply 700 through a path to the ground.

Detector 780 detects a voltage across smoothing capacitor 720 and outputs a detected voltage value 791 to controller 790. Detected voltage value 791 is compared with the first threshold by comparator 792, and bidirectional switch 760 is brought into conduction on the condition that voltage value 791>first threshold.

Bringing bidirectional switch 760 into conduction causes a common mode current to circulate via Y capacitor 770, resulting in lower noise.

Since common-mode choke coil 7000 is installed in the three-phase AC power supply line in the present embodiment, common mode noise that seeps in the three-phase power supply line can be reduced further and circulates through Y capacitor 770, resulting in lower noise.

In the present embodiment, bidirectional switch 760 turns on the condition that voltage value 791>first threshold, that is, the condition that smoothing capacitor 720 is sufficiently charged and voltage variations of an AC power frequency that is superimposed on DC buses ML1 and ML2 are also reduced. This eliminates or reduces a leakage current generated from Y capacitor 770, avoiding a leakage breaker malfunction.

As described above, the present embodiment can achieve a power converter that has lower noise characteristics and avoids a leakage breaker malfunction.

Although the present embodiment has described the configuration obtained by adding a common-mode choke coil to the configuration of Embodiment 1, the present invention is not limited thereto. The common-mode choke coil can be similarly added to the configuration of any other embodiment.

Embodiment 8

Figure 10:
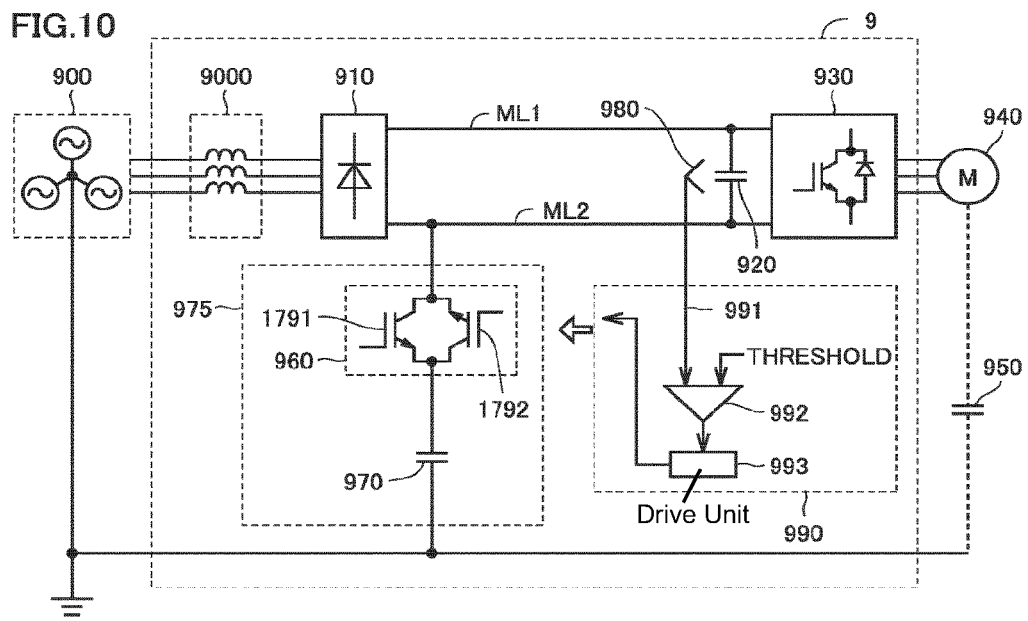
FIG. 10 is a circuit diagram of a power converter according to Embodiment 8.

FIG. 10 is a circuit diagram of a power converter 9 according to Embodiment 8.

As illustrated in FIG. 10, power converter 9 includes a common-mode choke coil 9000, a diode rectifier 910, a smoothing capacitor 920, an inverter 930, a bypass circuit 975, a detector 980, and a controller 990. Bypass circuit 975 includes a bidirectional switch 960 and a Y capacitor 970. Controller 990 includes a comparator 992 and a drive unit 993.

Common-mode choke coil 9000 is disposed in a three-phase AC power supply line between diode rectifier 910 and a three-phase AC power supply 900.

Diode rectifier 910 rectifies an AC voltage output from neutral-grounding three-phase AC power supply 900 into a DC voltage and outputs the DC voltage to DC buses ML1 and ML2.

Smoothing capacitor 920 smoothes the DC voltage rectified by diode rectifier 910.

Inverter 930 converts the DC voltage smoothed by smoothing capacitor 920 into a desired AC voltage, thereby driving electric motor 940.

Bidirectional switch 960 and Y capacitor 970 are connected in series between one end of smoothing capacitor 920 and the ground. Y capacitor 970 reduces the noise caused by switching of a switching element of inverter 930.

Detector 980 detects a voltage across both ends of smoothing capacitor 920.

Controller 990 drives bidirectional switch 960 in response to an output of detector 980.

Controller 990 brings bidirectional switch 960 into conduction when the output value of detector 980 is greater than the first threshold.

Comparator 992 compares the voltage detected by detector 980 with the first threshold. Drive unit 993 controls on/off of bidirectional switch 960 based on the comparison result of comparator 992. Bidirectional switch 960 is composed of reverse blocking IGBTs 1791 and 1792 connected in inverse parallel. Reverse blocking IGBTs 1791 and 1792 have high reverse blocking voltage capability.

The operation of power converter 9 of FIG. 10 will now be described.

The three-phase AC voltage from neutral-grounding three-phase AC power supply 900 is rectified by diode rectifier 910 and is then turned into a DC voltage by smoothing capacitor 920. This DC voltage is converted into a desired AC voltage through well-known PWM control by inverter 930, so that electric motor 940 is driven by the AC voltage.

A stray capacitance 950 exists between electric motor 940 and the ground. When inverter 930 is driven through PWM control, voltage variations are applied to stray capacitance 950 by a switching operation of power-conversion semiconductor elements of inverter 930, and generate a common mode current. This common mode current propagates toward three-phase AC power supply 900 through a path to the ground.

Detector 980 detects a voltage across smoothing capacitor 920 and outputs a detected voltage value 991 to controller 990. Detected voltage value 991 is compared with the first threshold by the comparator 992, and on the condition that voltage value 991>first threshold, reverse blocking IGBTs 1791 and 1792 are simultaneously turned on to bring switch 960 into conduction.

Since bidirectional switch 960 is composed of reverse blocking IGBTs 1791 and 1792 in the present embodiment, the number of elements constituting bidirectional switch 960 can be reduced, resulting in a small-size implementation.

As described above, the present embodiment enables small-size implementation while reducing noise and avoiding a leakage breaker malfunction.

Although the present embodiment has described the switch composed of reverse blocking IGBTs 1791 and 1792 connected in inverse parallel as a specific configuration of the bidirectional switch of Embodiment 1, the present invention is not limited thereto. Similarly, a bidirectional switch having such a configuration can also be used for the configuration of any other embodiment.

Embodiment 9

Figure 11:
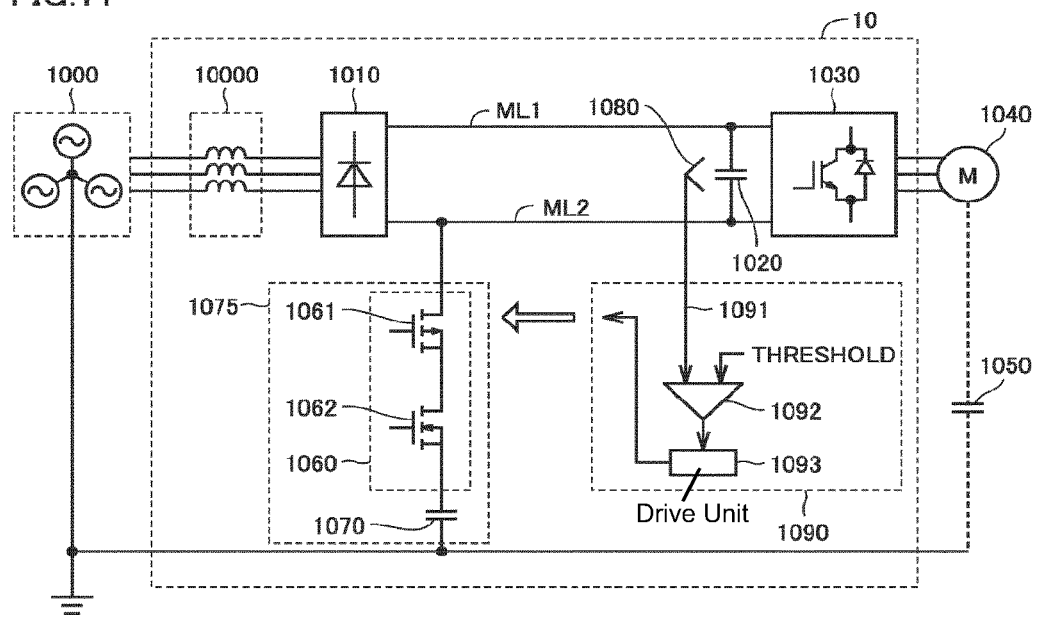
FIG. 11 is a circuit diagram of a power converter according to Embodiment 9.

FIG. 11 is a circuit diagram of a power converter 10 according to Embodiment 9.

As illustrated in FIG. 11, power converter 10 includes a common-mode choke coil 10000, a diode rectifier 1010, a smoothing capacitor 1020, an inverter 1030, a bypass circuit 1075, a detector 1080, and a controller 1090. Bypass circuit 1075 includes a bidirectional switch 1060 and a Y capacitor 1070. Controller 1090 includes a comparator 1092 and a drive unit 1093.

Common-mode choke coil 10000 is disposed in a three-phase AC power supply line between diode rectifier 1010 and three-phase AC power supply 1000.

Diode rectifier 1010 rectifies an AC voltage output from neutral-grounding three-phase AC power supply 1000 into a DC voltage and outputs the DC voltage to DC buses ML1 and ML2.

Smoothing capacitor 1020 smoothes the DC voltage rectified by diode rectifier 1010.

Inverter 1030 converts the DC voltage smoothed by smoothing capacitor 1020 into a desired AC voltage, thereby driving electric motor 1040.

Bidirectional switch 1060 and Y capacitor 1070 are connected in series between one end of smoothing capacitor 1020 and the ground. Y capacitor 1070 reduces the noise caused by switching of a switching element of inverter 1030.

Detector 1080 detects a voltage across both ends of smoothing capacitor 1020.

Controller 1090 drives bidirectional switch 1060 in response to an output of detector 1080.

Controller 1090 brings bidirectional switch 1060 into conduction when the output value of detector 1080 is greater than the first threshold.

Comparator 1092 compares the voltage detected by detector 1080 with the first threshold. Drive unit 1093 controls on/off of bidirectional switch 1060 based on the comparison result of comparator 1092.

Bidirectional switch 1060 includes a P-channel MOSFET (metal-oxide-semiconductor field-effect transistor) 1061 and an N-channel MOSFET 1062 connected in inverse series.

P-channel MOSFET 1061 and N-channel MOSFET 1062 are simultaneously turned on or simultaneously turned off in response to a control signal from drive unit 1093.

The operation of power converter 10 of FIG. 11 will now be described.

A three-phase AC voltage across a neutral-grounding three-phase AC power supply 1000 is rectified by diode rectifier 1010 and is then turned into a DC voltage by smoothing capacitor 1020. This DC voltage is converted into a desired AC voltage through well-known PWM control by inverter 1030, so that electric motor 1040 is driven by this AC voltage.

A stray capacitance 1050 exists between electric motor 1040 and the ground. When inverter 1030 is driven through PWM control, voltage variations are applied to stray capacitance 1050 by a switching operation of a power-conversion semiconductor element of inverter 1030, and generate a common mode current. This common mode current propagates toward the AC power supply through a path to the ground.

Detector 1080 detects a voltage across smoothing capacitor 1020 and outputs a detected voltage value 1091 to controller 1090. Detected voltage value 1091 is compared with the first threshold by comparator 1092, and on the condition that voltage value 1091>first threshold, P-channel MOSFET 1061 and N-channel MOSFET 1062 are simultaneously turned on to bring switch 1060 into conduction.

Bidirectional switch 1060 is composed of P-channel MOSFET 1061 and N-channel MOSFET 1062 connected in inverse series. One end of P-channel MOSFET 1061 is connected to DC bus ML2 of the DC buses.

Since bidirectional switch 1060 is composed of MOSFETs in the present embodiment, the number of elements constituting bidirectional switch 1060 can be reduced, resulting in small-size implementation.

Since P-channel MOSFET 1061 is connected to DC bus ML2 in the present embodiment, a DC bus voltage can be used as a source potential in gate driving of P-channel MOSFET 1061. This obviates the need for a separate insulating device, resulting in small-size implementation.

As described above, the present embodiment enables small-size implementation while reducing noise and avoiding a leakage breaker malfunction.

Although the present embodiment has descried the switch composed of P-channel MOSFET 1061 and N-channel MOSFET 1062 connected in inverse series as a specific configuration of the bidirectional switch of Embodiment 1, the present invention is not limited thereto. Similarly, a bidirectional switch having such a configuration can also be used for the configuration of any other embodiment.

Embodiment 10

In Embodiment 10, the bidirectional switch included in the bypass circuit described in the above embodiment includes a bidirectional single element.

Figure 12:
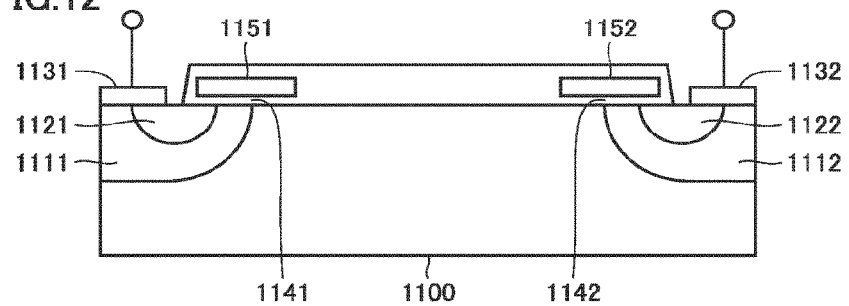
FIG. 12 is a schematic sectional view of a bidirectional single element according to Embodiment 10.

FIG. 12 is a sectional view of a bidirectional transverse insulated-gate transistor, which is one example of the bidirectional single element according to Embodiment 10.

With reference to FIG. 12, the bidirectional transverse insulated-gate transistor includes an n-type semiconductor layer 1100, p+ well regions 1111 and 1112, n+ emitter regions 1121 and 1122, emitter electrodes 1131 and 1132, gate insulating films 1141 and 1142, and gate electrodes 1151 and 1152.

The operation of the bidirectional transverse insulated-gate transistor of FIG. 12 will now be described.

Two p+ well regions 1111 and 1112 are formed in n-type semiconductor layer 1100. Inside p+ well regions 1111 and 1112, n+ emitter regions 1121 and 1122 are formed, respectively.

P+ well regions 1111 and 1112 are formed in the surface of n-type semiconductor layer 1100 and are formed with a predetermined distance therebetween for maintaining a desired breakdown voltage.

Gate electrode 1151 is formed above a boundary between p+ well region 1111 and n+ emitter region 1121 via gate insulating film 1141, and gate electrode 1152 is formed above a boundary between p+ well region 1112 and n+ emitter region 1122 via gate insulating film 1142.

Emitter electrode 1131 is formed across p+ well region 1111 and n+ emitter region 1121, and emitter electrode 1132 is formed across p+ well region 1112 and n+ emitter region 1122.

In this bidirectional single element, a current flowing between emitter electrodes in both directions can be controlled through control of the voltage applied to gate electrodes 1151 and 1152.

Since the bidirectional element is composed of a bidirectional single element in the present embodiment, the number of elements constituting a bidirectional switch can be reduced, resulting in small-size implementation.

As described above, the present embodiment enables small-size implementation while reducing noise and avoiding a leakage breaker malfunction.

Although the present embodiment has described the switch composed of a bidirectional single element as a specific configuration of the bidirectional switch of Embodiment 1, the present invention is not limited thereto. Similarly, a bidirectional switch having such a configuration can also be used for the configuration of any other embodiment.

Embodiment 11

Figure 13:
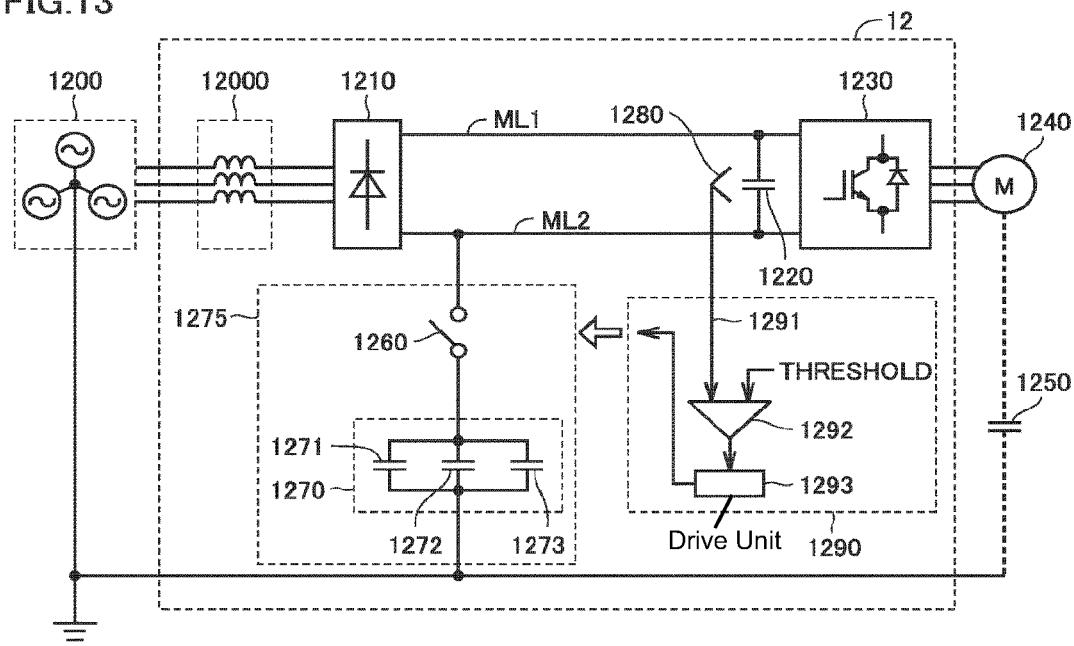
FIG. 13 is a circuit diagram of a power converter according to Embodiment 11.

FIG. 13 is a circuit diagram of a power converter 12 according to Embodiment 11.

As illustrated in FIG. 13, power converter 12 includes a common-mode choke coil 12000, a diode rectifier 1210, a smoothing capacitor 1220, an inverter 1230, a bypass circuit 1275, a detector 1280, and a controller 1290. Bypass circuit 1275 includes a bidirectional switch 1260 and a Y capacitor unit 1270. Y capacitor unit 1270 includes Y capacitors 1271, 1272, and 1273 that have different frequency characteristics and are connected in parallel. Controller 1290 includes a comparator 1292 and a drive unit 1293.

Common-mode choke coil 12000 is disposed in a three-phase AC power supply line between diode rectifier 1210 and a three-phase AC power supply 1200.

Diode rectifier 1210 rectifies an AC voltage output from neutral-grounding three-phase AC power supply 1200 to a DC voltage and outputs the DC voltage to DC buses ML1 and ML2.

Smoothing capacitor 1220 smoothes the DC voltage rectified by diode rectifier 1210.

Inverter 1230 converts the DC voltage smoothed by smoothing capacitor 1220 into a desired AC voltage, thereby driving electric motor 1240.

Bidirectional switch 1260 and Y capacitor unit 1270 are connected in series between one end of smoothing capacitor 1220 and the ground. Y capacitor unit 1270 reduces the noise caused by switching of a switching element of inverter 1230.

Y capacitor unit 1270 includes Y capacitor 1271, Y capacitor 1272, and Y capacitor 1273.

Letting capacitance components of Y capacitors 1271, 1272, and 1273 be c1, c2, and c3, respectively, and inductance components thereof be l1, l2, and l3, respectively, $c3 \geq c2 \geq c1$ and $l3 > l2 > l1$ hold. A low-frequency noise propagates through Y capacitor 1271, a middle-frequency noise propagates through Y capacitor 1272, and a high-frequency noise propagates through Y capacitor 1273.

Detector 1280 detects a voltage across both ends of smoothing capacitor 1220.

Controller 1290 drives bidirectional switch 1060 in response to an output of detector 1280.

Controller 1290 brings bidirectional switch 1260 into conduction when the output value of detector 1280 is greater than the first threshold.

Comparator 1292 compares the voltage detected by detector 1280 with the first threshold. Drive unit 1293 controls on/off of bidirectional switch 1260 based on the comparison result of comparator 1292.

The operation of power converter 12 of FIG. 13 will now be described.

The three-phase AC voltage across neutral-grounding three-phase AC power supply 1200 is rectified by diode rectifier 1210 and is then turned into a DC voltage by smoothing capacitor 1220. This DC voltage is converted into a desired AC voltage through well-known PWM control by inverter 1230, so that electric motor 1240 is driven by the AC voltage.

A stray capacitance 1250 exists between electric motor 1240 and the ground. When inverter 1230 is driven through PWM control, voltage variations are applied to stray capacitance 1250 by the switching operation of a power-conversion semiconductor element of inverter 1230, thereby generating a common mode current. This common mode current propagates toward the AC power supply through a path to the ground.

Detector 1280 detects the voltage across smoothing capacitor and outputs a detected voltage value 1291 to controller 1290. Detected voltage value 1291 is compared with the first threshold by comparator 1292, and bidirectional switch 1260 is brought into conduction on the condition that voltage value 1291 > first threshold.

Bringing bidirectional switch 1260 into conduction causes the common mode current to circulate via Y capacitor unit 1270, resulting in lower noise.

In the present embodiment, Y capacitors 1271, 1272, and 1273 constituting Y capacitor unit 1270 have different frequency characteristics. The frequency characteristics of the Y capacitor are represented by series connection of a capacitance component and an inductance component. In other words, the capacitance component is dominant in the low-frequency range, the inductance component is dominant in the high-frequency range, and the Y capacitors do not function as the noise propagation path in the high-frequency range. Since Y capacitors having different frequency characteristics are used in parallel connection in the present embodiment, the Y capacitors exhibit capacitance components in a wide range from low frequency to high frequency and function as a noise propagation path. Also when Y capacitors 1271, 1272, and 1273 have the same frequency characteristics, connecting these capacitors in parallel increases the capacity of a capacitor capacitance and reducing an internal inductance, causing these Y capacitors to function as a noise propagation path.

Since bidirectional switch 1260 turns on the condition that voltage value 1291 > first threshold, that is, on the condition that smoothing capacitor 1220 is charged sufficiently and the voltage variations of an AC power frequency to be superimposed on DC buses ML1 and ML2 are reduced in the present embodiment, the leakage current generated from Y capacitors 1271 to 1273 can be eliminated or reduced, avoiding a leakage breaker malfunction.

As described above, the present embodiment can achieve a power converter that has lower noise and avoids a leakage breaker malfunction.

Although the present embodiment has described the configuration in which the Y capacitor of Embodiment 1 is replaced with a plurality of parallel-connected Y capacitors, the present invention is not limited thereto. Similarly, a plurality of parallel-connected Y capacitors described above can also be used for the configuration of any other embodiment.

It should be construed that the embodiments disclosed herein are given by way of illustration in all respects, not by way of limitation. It is therefore intended that the scope of the present invention is defined by claims, not only by the embodiments described above, and encompasses all modifications and variations equivalent in meaning and scope to the claims.

REFERENCE SIGNS LIST 1-7, 9, 10, 12: power converter; 100, 200, 300, 400, 500, 600, 700, 900, 1000, 1200: three-phase AC power supply; 110, 210, 310, 410, 510, 610, 710, 910, 1010, 1210: diode rectifier; 120, 220, 320, 420, 520, 620, 720, 920, 1020, 1220, 6020: smoothing capacitor; 130, 230, 330, 430, 530, 630, 730, 930, 1030, 1230: inverter; 140, 240, 340, 440, 540, 640, 740, 940, 1040, 1240: electric motor; 150, 250, 350, 450, 550, 650, 750, 950, 1050, 1250: stray capacitance; 160, 260, 360, 460, 560, 660, 760, 960, 1060, 1260: bidirectional switch; 170, 270, 370, 470, 570, 670, 770, 970, 1070, 1271, 1272, 1273: Y capacitor; 175, 275, 375, 475, 575, 675, 775, 975, 1075, 1275: bypass circuit; 180, 280, 380, 480, 580, 680, 780, 980, 1080, 1280: detector; 192, 295, 392, 495, 692, 792, 992, 1092, 1292: comparator; 193, 296, 393, 496, 596, 693, 793, 993, 1093, 1293: drive unit; 292, 492, 592: computing unit (filter); 293, 493, 593: computing unit (absolute value); 294, 494, 594: computing unit (peak value), 595: data table; 561, 562: IGBT; 563, 564: diode; 6000: chopper; 1270: Y capacitor portion; 6001, 6002: power-conversion semiconductor element; 6010: reactor; 7000, 9000, 10000, 12000: common-mode choke coil; 801: magnetic field in common-mode choke coil; 810: R-phase of three-phase AC power supply line; 811: leakage magnetic field of R-phase; 820: S-phase of three-phase AC power supply line; 821: leakage magnetic field of S-phase; 830: T-phase of three-phase AC power supply line; 831: leakage magnetic field of T-phase; 1791, 1792: reverse blocking IGBT; 1061: P-channel MOSFET; 1062: N-channel MOSFET; 1100: n-type semiconductor layer; 1111, 1112: p+ well region; 1121, 1122: n+ emitter region; 1131, 1132: emitter electrode; 1141, 1142: gate insulating film; 1151, 1152: gate electrode; C1: common mode current; ML1, ML2: DC bus.

The invention claimed is:

1. A power converter comprising:
a rectifier circuit configured to rectify an AC voltage output from a neutral-grounding three-phase AC power supply to a DC voltage and output the DC voltage to a DC bus;
a smoothing capacitor configured to smooth the DC voltage rectified by the rectifier circuit;
a conversion circuit configured to convert the DC voltage smoothed by the smoothing capacitor into a desired AC voltage;

a bidirectional switch and at least one Y capacitor connected in series between one end of the smoothing capacitor and the ground, the bidirectional switch including a first end connected to the smoothing capacitor and a second end connected to a first end of the Y capacitor, the Y capacitor including a second end connected to the ground;

a detector positioned across the smoothing capacitor such that the detector is configured to detect a voltage across both ends of the smoothing capacitor; and a controller configured to drive the bidirectional switch in response to an output of the detector, the controller bringing the bidirectional switch into conduction when a peak value or an average value of an absolute value of a variation component of an output value of the detector is smaller than a threshold, wherein the detector is connected to a comparator, and wherein the bidirectional switch and the at least one Y capacitor are not directly connected to the comparator.

2. The power converter according to claim 1, wherein the controller controls a resistance value of the bidirectional switch in accordance with the output value of the detector.

3. The power converter according to claim 1, wherein the bidirectional switch comprises a bidirectional semiconductor switch.

4. The power converter according to claim 3, wherein the bidirectional semiconductor switch includes IGBTs connected in inverse parallel.

5. The power converter according to claim 3, wherein the bidirectional semiconductor switch includes reverse blocking IGBTs connected in inverse parallel.

6. The power converter according to claim 3, wherein the bidirectional semiconductor switch includes a P-channel MOSFET and an N-channel MOSFET connected in inverse series.

7. The power converter according to claim 6, wherein the P-channel MOSFET is connected to the DC bus.

8. The power converter according to claim 3, wherein the bidirectional semiconductor switch comprises one bidirectional element.

9. The power converter according to claim 1, further comprising a chopper circuit between the smoothing capacitor and the conversion circuit.

10. The power converter according to claim 1, further comprising a common-mode choke coil between the three-phase AC power supply and the rectifier circuit.

11. The power converter according to claim 1, wherein the at least one Y capacitor includes a plurality of Y capacitors, and the plurality of Y capacitors are connected in parallel.

12. The power converter according to claim 11, wherein the at least one Y capacitor includes a plurality of Y capacitors, and the plurality of Y capacitors differ from each other in frequency characteristics and are connected in parallel.

13. The power converter according to claim 1, wherein the threshold is a voltage value of an AC power supply frequency component.

14. A power converter comprising:

a rectifier circuit configured to rectify an AC voltage output from a neutral-grounding three-phase AC power supply to a DC voltage and output the DC voltage to a DC bus;

a smoothing capacitor configured to smooth the DC voltage rectified by the rectifier circuit;

a conversion circuit configured to convert the DC voltage smoothed by the smoothing capacitor into a desired AC voltage;

a bidirectional switch and at least one Y capacitor connected in series between one end of the smoothing capacitor and the ground, the bidirectional switch including a first end connected to the smoothing capacitor and a second end connected to a first end of the Y capacitor, the Y capacitor including a second end connected to the ground;

a detector positioned above the smoothing capacitor such that the detector is configured to detect a current flowing through the smoothing capacitor; and a controller configured to drive the bidirectional switch in accordance with an output value of the detector, wherein the controller brings the bidirectional switch into conduction when a peak value or an average value of an absolute value of a variation component of the output value of the detector is smaller than a threshold, wherein the detector is connected to a comparator, and wherein the bidirectional switch and the at least one Y capacitor are not directly connected to the comparator.

15. The power converter according to claim 14, wherein the threshold is an AC power frequency component of a value of the current flowing into the smoothing capacitor.

* * * * *